(12) United States Patent
Perdew et al.

(10) Patent No.: US 10,869,410 B1
(45) Date of Patent: Dec. 15, 2020

(54) AIR HANDLING UNIT WITH INDIRECT AIR-SIDE ECONOMIZER AND DECOUPLED VARIABLE SPEED SCAVENGER AND CONDENSER FAN CONTROL

(71) Applicant: Munters Corporation, Selma, TX (US)

(72) Inventors: Bradley J. Perdew, Raphine, VA (US); Michael D. Herwald, Clifton Forge, VA (US)

(73) Assignee: Munters Corporation, Selma, TX (US)

( * ) Notice: Subject to any disclaimer, the term of this patent is extended or adjusted under 35 U.S.C. 154(b) by 0 days.

(21) Appl. No.: 16/454,647

(22) Filed: Jun. 27, 2019

(51) Int. Cl.
| | |
|---|---|
| *H05K 7/20* | (2006.01) |
| *F24F 13/30* | (2006.01) |
| *F24F 11/86* | (2018.01) |
| *F24F 13/20* | (2006.01) |

(52) U.S. Cl.
CPC ......... *H05K 7/20745* (2013.01); *F24F 13/30* (2013.01); *F24F 11/86* (2018.01); *F24F 2013/205* (2013.01)

(58) Field of Classification Search
CPC ...... H05K 7/20745; F24F 13/30; F24F 11/86; F24F 2013/205
USPC ................................................. 361/696, 701
See application file for complete search history.

(56) References Cited

U.S. PATENT DOCUMENTS

| | | | |
|---|---|---|---|
| 4,377,074 A | 3/1983 | Jardine | |
| 4,987,952 A | 1/1991 | Beal et al. | |
| 6,523,604 B1 | 2/2003 | Brooks et al. | |
| 8,583,289 B2 | 11/2013 | Stack et al. | |
| 8,966,922 B2 | 3/2015 | Campbell et al. | |
| 9,021,821 B2 | 5/2015 | Dunnavant | |
| 9,032,742 B2 | 5/2015 | Dunnavant | |
| 9,055,696 B2 | 6/2015 | Dunnavant | |
| 9,101,078 B2 | 8/2015 | Campbell et al. | |
| 9,278,303 B1 | 3/2016 | Somani et al. | |
| 9,313,929 B1 | 4/2016 | Malone et al. | |
| 9,521,783 B2 | 12/2016 | Leckelt et al. | |

(Continued)

FOREIGN PATENT DOCUMENTS

WO 2010/011687 A2 1/2010

OTHER PUBLICATIONS

Dunnavant, "Indirect Air-Side Economizer Cycle: Data Center Heat Rejection," ASHRAE Journal, Mar. 2011, pp. 44-54.

(Continued)

*Primary Examiner* — Stephen S Sul
(74) *Attorney, Agent, or Firm* — Venable LLP (57) ABSTRACT

A cooling system includes a housing containing indirect heat exchange and active refrigeration sub-systems to provide cooled process air to a space. The indirect heat exchange sub-system includes a horizontal plate-type heat exchanger having scavenger passages that are longer in one direction than process air passages are in a transverse direction. One group of compressors and associated condensers is located within the housing near a right end wall and another group is located near a left end wall. Process air fans are provided for directing process air from the space, through the heat exchanger, and back into the space. Scavenger fans direct scavenger air through the heat exchanger. At least two condenser fans are provided, one at the top of the housing near the right end wall and the other at the top of the housing near the left end wall.

15 Claims, 4 Drawing Sheets

(56) References Cited

U.S. PATENT DOCUMENTS

| | | | |
|---|---|---|---|
| 9,949,410 B1* | 4/2018 | Kowalski | H05K 7/20745 |
| 2004/0061245 A1 | 4/2004 | Maisotsenko et al. | |
| 2009/0301123 A1* | 12/2009 | Monk | H05K 7/1497 |
| | | | 62/259.2 |
| 2010/0130117 A1 | 5/2010 | Larsen | |
| 2012/0167610 A1 | 7/2012 | Dunnavant | |
| 2012/0171943 A1* | 7/2012 | Dunnavant | F28D 15/02 |
| | | | 454/184 |
| 2012/0211198 A1* | 8/2012 | Kinkel | F24F 1/02 |
| | | | 165/104.14 |
| 2013/0081784 A1* | 4/2013 | Faig Palomer | H05K 7/20745 |
| | | | 165/80.2 |
| 2014/0102689 A1 | 4/2014 | Yoo et al. | |
| 2015/0096714 A1* | 4/2015 | Dagley | F24F 12/003 |
| | | | 165/8 |
| 2015/0208552 A1 | 7/2015 | Mornan et al. | |
| 2015/0369527 A1* | 12/2015 | Ghadiri Moghaddam | |
| | | | F24F 12/006 |
| | | | 62/89 |
| 2016/0106008 A1* | 4/2016 | Cotton | H05K 7/20836 |
| | | | 165/248 |
| 2018/0279509 A1* | 9/2018 | Leckelt | H05K 7/20745 |
| 2019/0107344 A1* | 4/2019 | Rede | F28F 25/04 |

OTHER PUBLICATIONS

Lin, et al., "Choosing Between Direct and Indirect Air Economization for Data Centers," Schneider Electric White Paper 215, 2015, pp. 1-16.

* cited by examiner

AIR HANDLING UNIT WITH INDIRECT AIR-SIDE ECONOMIZER AND DECOUPLED VARIABLE SPEED SCAVENGER AND CONDENSER FAN CONTROL

BACKGROUND OF THE INVENTION

1. Field of the Invention

This disclosure is directed to systems and methods for removing heat from recirculated air from an enclosed space, particularly from a data center, in an efficient and effective manner. Data centers include data servers and other equipment, which draw significant amounts of power and generate significant amounts of heat. Data center heat rejection, particularly in an economical manner, has become an increasing challenge.

2. Description of the Related Art

Computer servers historically were cooled by refrigeration air-conditioning and the supply air was delivered into the data centers by all available means, including through raised flooring, to individually cool each computer server. More recently, data center cooling technology introduced construction of specific air pathways with segregated, enclosed cold air supply aisles ("cold aisles") and separate hot air return aisles ("hot aisles") within data centers in an attempt to keep from commingling cold air with hot air in an open space. Such construction aids in providing necessary cooling capacity more economically and reduces the potential for server hot spots. The industry also determined that warmer server inlet conditions for Class I and II data centers was acceptable. That, combined with advances in hot and cold aisle containment systems and designs, permits data center cooling units to deliver warmer air to cool the servers than previously thought possible. In 2008, an expanded envelope for air conditions entering the servers in data centers was approved, bringing the maximum recommended server inlet temperature up to 80.6° F. The above change in recommended inlet air temperature for the data servers caused engineers to seek new energy efficient solutions to manage the thermal loads in the data centers.

In a typical indirect air-side economizer (IASE) installation, outside (scavenger) air (O/A) enters the IASE through an inlet and flows through one side of an air-to-air heat exchanger. Warm return air (R/A) from the environment which the IASE supports such as, for example, a data center, and specifically the return air from a hot aisle, enters the IASE from another inlet and flows separately through an opposite side of the air-to-air heat exchanger. The scavenger air flow and the return air flow are completely separated from one another by one of a number of different methodologies. These methodologies may include sealed heat exchanger plates and/or sealed heat exchanger tubing, or separating partitions in the case of heat pipe type heat exchangers. As the return air flows through a plate-type air-to-air heat exchanger, it transfers its heat to the cooler scavenger air through the plate surface that completely separates and segregates the two airstreams. The outside scavenger air may be used at its ambient temperature, or may be otherwise evaporatively cooled, either prior to entering the air-to-air heat exchanger or by direct spray of water onto the surfaces of the heat exchanger. Use of evaporative pre-cooling may enhance the heat rejection potential, particularly in instances where the outside air has a Wet-Bulb Depression (WBD), which is a difference between the dry-bulb and wet bulb temperature, of 10° F. or more. A water-side economizer coil, piped to an external cooling tower, may be installed, for example, upstream of the direct evaporative cooler, providing additional cooling for the scavenger air and associated heat rejection. As another option, the IASE can be supplemented by a separate refrigeration system, such as a direct expansion (DX) refrigeration system. The evaporator of the DX system can be placed in the process air stream to either further cool the process air or be the sole source for cooling when ambient conditions render the IASE ineffective.

SUMMARY OF THE INVENTION

According to one aspect, the present invention is directed to a cooling system, including an indirect heat exchange sub-system and an active refrigeration sub-system, for cooling process air and providing the process air to a space. The cooling system includes a housing, a horizontal plate-type heat exchanger of the indirect heat exchange sub-system, two groups of compressors and associated condensers of the active refrigeration sub-system, at least one process air fan, at least one heat exchanger scavenger fan, and two groups of condenser fans. The housing has front and back side walls facing one another in a first direction, left and right end walls facing one another in a second direction transverse to the first direction, and a bottom and a top facing one another in a third direction transverse to the first and second directions. The housing further includes a process air supply opening connecting with the space, a process air return opening connecting with the space, a heat exchanger scavenger air inlet opening, a heat exchanger scavenger air exhaust opening, condenser air inlet openings, and condenser air exhaust openings. The horizontal plate-type heat exchanger is provided in the housing and includes stacked horizontal plates separated by scavenger passages, the scavenger passages extending in the first direction, the horizontal plates defining horizontal process air passages extending in the second direction, and the scavenger passages being longer in the first direction than the process air passages are in the second direction. Each of the two groups of compressors and associated condensers includes at least one compressor and at least one associated condenser, one of the groups being located within the housing near the right end wall and the other of the groups being located within the housing near the left end wall. The at least one process air fan directs the process air from the process air return opening, through the process air passages of the heat exchanger, and then through the process air supply opening and into the space. The at least one heat exchanger scavenger fan directs the scavenger air from ambient, through the scavenger passages of the heat exchanger, and then back to ambient. The two groups of condenser fans direct condenser air from ambient, through the condensers, and then back to ambient, each of the groups including at least one condenser fan, one of the two groups of condenser fans being located at the top of the housing near the right end wall, and the other of the two groups of condenser fans being located at the top of the housing near the left end wall.

According to another aspect, the present invention is directed to a cooling system, including an indirect heat exchange sub-system and an active refrigeration sub-system, for cooling process air and providing the process air to a space, and which includes a housing, a horizontal plate-type heat exchanger of the indirect heat exchange sub-system provided in the housing, two groups of compressors and associated condensers of the active refrigeration sub-system, and two groups of condenser fans. The housing has front and back side walls facing one another in a first direction, two end side walls facing one another in a second direction transverse to the first direction, and a bottom and a top facing one another in a third direction transverse to the first and second directions. The housing further includes a process air supply opening connecting with the space, a process air return opening connecting with the space, a heat exchanger scavenger air inlet opening, a heat exchanger scavenger air exhaust opening, condenser air inlet openings, and condenser air exhaust openings. Each of the two groups of compressors and associated condensers includes at least one compressor and at least one associated condenser, one of the groups being located within the housing near one of the end side walls and the other of the groups being located within the housing near the other of the end side walls. The two groups of condenser fans directing condenser air from ambient, through the condensers, and then back to ambient, and each of the groups includes at least one condenser fan. One of the two groups of condenser fans is located at the top of the housing near the one side end wall and vertically aligned with at least a part of the process air supply opening, and the other of the two groups of condenser fans is located at the top of the housing near the other end side wall and vertically aligned with at least a part of the process air return opening.

The systems and methods according to this disclosure provide an improved and more efficient indirect air-side economizer (IASE) that includes at least one air-to-air heat exchanger. The preferred embodiments provide a decreased footprint for the system as compared to prior comparable systems, which is particularly beneficial in rooftop applications. Despite the smaller size, the system of the present invention also provides more efficient and economical operation.

These and other aspects and advantages will become apparent when the description below is read in conjunction with the accompanying drawings.

DESCRIPTION OF THE PREFERRED EMBODIMENTS

1. Overall System Configuration

Figure 1:
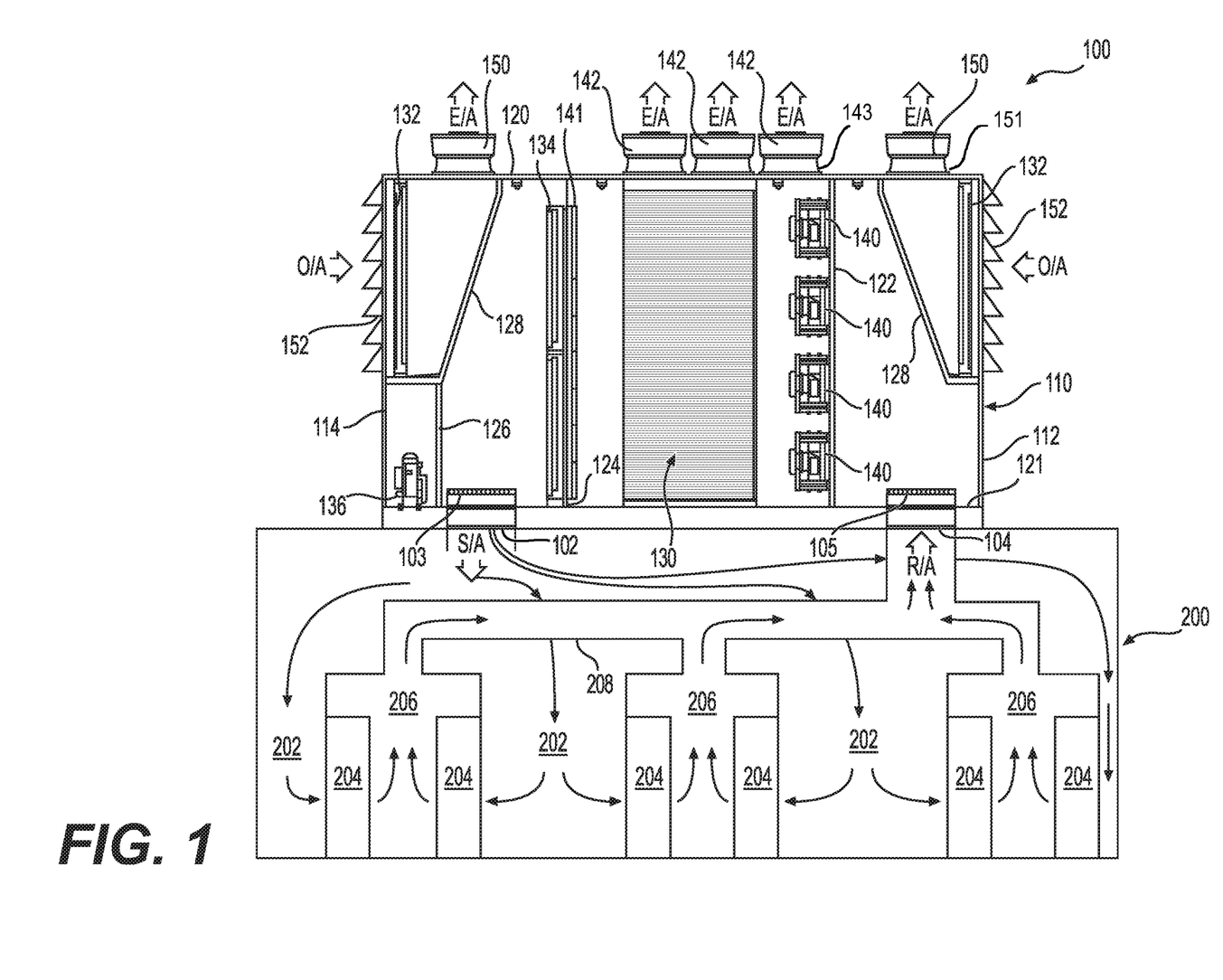
FIG. 1 is an elevation view of an air handling unit according to one aspect of the present invention.
Figure 2:
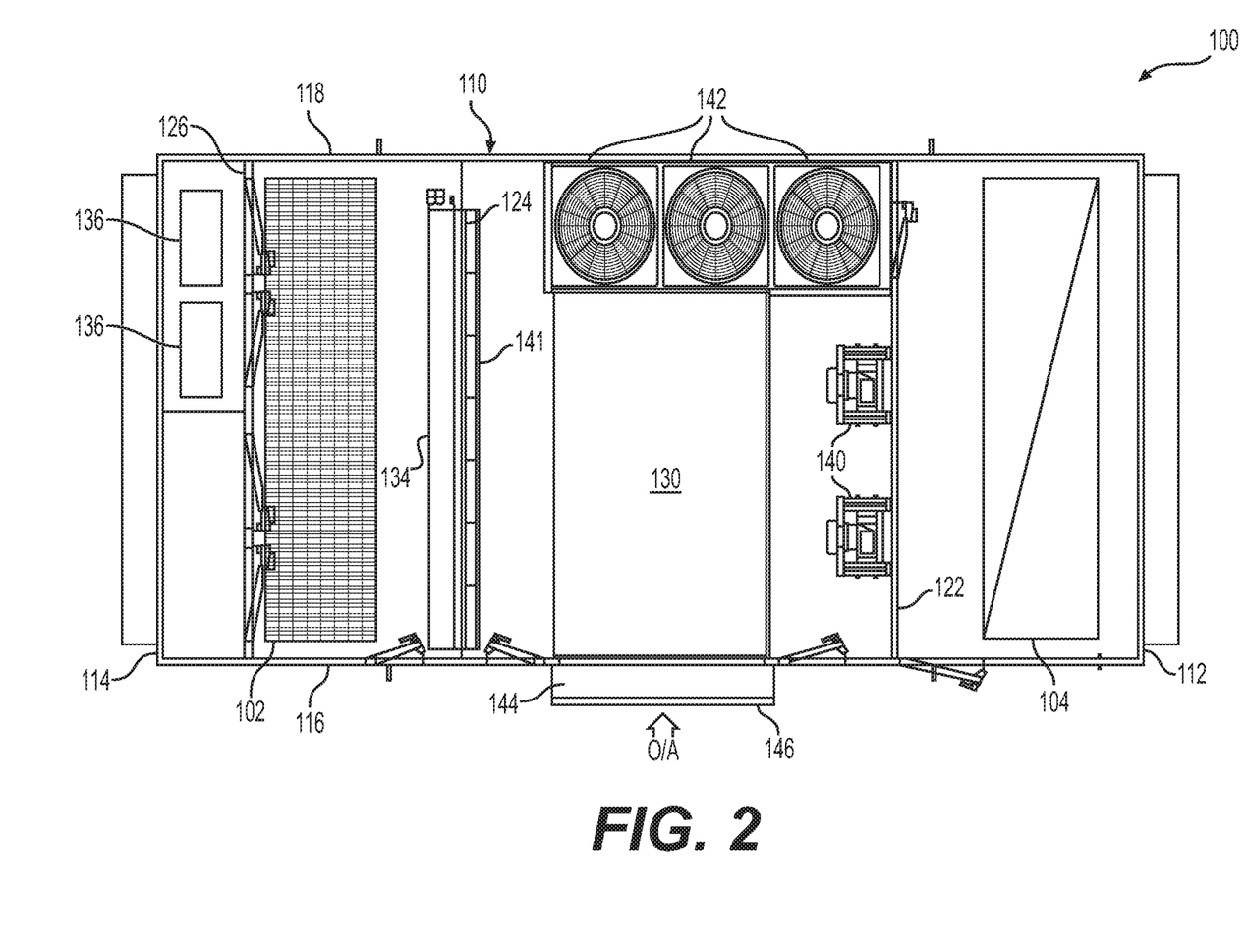
FIG. 2 is a plan view of the air handling unit according to one aspect of the present invention.

The overall system configuration of the present invention will now be described with reference to FIGS. 1 and 2. The different depicted air flows will be referred to as: (1) supply air (S/A), which is the cooled air output from the IASE to the cold aisles of the data center; (2) return air (R/A), which is the air returned to the IASE from the hot aisles in the data center; (3) outside (scavenger) air (O/A), which is the air input to the IASE from outside to the air-to-air heat exchanger in the IASE or air passed from the outside through the condenser coils; and (4) exhaust air (E/A), which is the air forcibly exhausted from the IASE as the O/A has passed through the air-to-air heat exchanger for heat extraction or the air forcibly exhausted from the condensers. FIGS. 1 and 2 respectively illustrate elevation and plan views of an exemplary overall data center cooling system according to this disclosure.

As shown in FIG. 1, a cooling system 100 for removing heat from a data center 200 includes several components, including, for example, an IASE and a DX refrigeration system as well as associated controls and ductwork to control the flow of supply air S/A to the cold aisles in the data center 200 to support cooling and, optionally, particulate removal of room generated contaminants. In a preferred embodiment, cooled supply air S/A from cooling system 100 is provided through supply opening 102 to cold aisles 202 of the data center 200 and is forced through the data servers 204 where the cooled supply air S/A absorbs heat and exits the data servers into hot aisles 206 as return air R/A. The return air R/A is then passed through the hot aisles back to the cooling system 100 including the IASE through a plenum or duct system 208. The return air R/A enters the cooling system 100 through a return opening 104 that may include a damper 105 for controlling flow of the return air R/A to the cooling system 100 and/or for isolating the system during maintenance. Supply opening 102 may also include a damper 103 for controlling flow of the supply air S/A from the cooling system 100 and/or for isolating the system during maintenance.

2. Structural Details of the Cooling System 100

The main components of cooling system 100 are enclosed in a housing 110. Housing 110 includes vertical end walls 112, 114, vertical front and back side walls 116, 118, a horizontal ceiling wall 120 defining a top, and a horizontal floor 121 defining a bottom, all of which define an interior space. Within the interior space are arranged additional structural members including a vertical fan support wall 122, a vertical evaporator support wall 124, and compressor housings 126 and condenser housings 128 provided at opposite ends. Only the left end compressor housing 126 is shown in FIG. 1, but a second compressor housing 126 is positioned at a corresponding location at the right side.

Housing 110 encloses a crossflow air-to-air heat exchanger 130 as well as the components of an auxiliary and/or backup cooling system, such as a DX refrigeration system, including condensers 132, evaporators 134, and compressors 136 (only shown at the left end of the housing). Several fans are provided to move the process air, outside scavenger air for heat exchanger 130, and outside cooling air for condensers 132. One or more variable volume plenum fans 140 (two columns of four fans each shown in the figures), preferably driven by direct drive motors, are mounted on fan support wall 122 upstream of heat exchanger 130. A return air filter bank 141 is mounted adjacent to evaporator support wall 124, preferably upstream of evaporator 134. Plenum fans 140 pull air from server room 200 through return opening 104 and direct the air through heat exchanger 130 and evaporator 134, thereby cooling the air, and then direct the cooled air back to the server room though supply opening 102.

Heat exchanger 130 can be of several designs, but is preferably of a crossflow horizontal plate type. In this system, the process air is directed horizontally across plural horizontal plates 130a stacked vertically and separated by scavenger passages 130b, which define process air passages 130c. The scavenger air is directed horizontally through the scavenger passages in a direction perpendicular to the process air flow direction. This enables efficient heat transfer between the process and scavenger air flows via the horizontal plates. The design of heat exchanger 130 is important in maximizing cooling efficiency as well as reducing the footprint of the system, as will be described later in more detail.

One or more variable volume heat exchanger scavenger fans 142 (three shown in the figures) are provided on ceiling wall 120 and pull outside air through scavenger inlet 144 provided in front side wall 116, horizontally through heat exchanger 130 and into a chamber adjacent the heat exchanger 130 and below the heat exchanger scavenger fans 142, and then vertically up through the fans to outside through heat exchanger scavenger exhaust opening 143. Heat exchanger scavenger fans 142 are preferably axial fans with direct drive motors. Scavenger inlet 144 is preferably provided with louvers and a bird screen, as well as a filter or filter bank 146.

Each condenser 132 is cooled by a group of one or more axial condenser fans 150, also disposed on the ceiling wall 120. The condenser fans 150 draw air through condenser fan inlet openings 152 and exhaust the air through condenser fan exhaust openings 151. The condenser fans 150 are provided separate from the heat exchanger scavenger fans 142, so that: a) the condensers are cooled by outdoor air that has not been negatively impacted by heat absorbed from the warm return air, and b) the fans are not required to overcome the static pressure resulting from flow through the heat exchanger. That is, each condenser is provided with at least one dedicated fan distinct from the scavenger fans. As a result, when ambient conditions are such that heat exchanger 130 will provide no benefit (e.g., at peak ambient temperatures), the heat exchanger scavenger fans 142 are shut down and, although the DX system is operating, the condenser fans 150 need draw air only through the condensers 132 and not through the heat exchanger 130, thus providing energy savings. Similarly, when the ambient conditions are such that the heat is rejected by a combination of passive rejection via the air-to-air heat exchangers and the DX system, the condenser air remains equal to ambient air, not having first absorbed heat from the air-to-air heat exchanger, allowing the DX system to operate more efficiently. Each group of condenser fans 150 draws outside air through opening 152, past the condenser coils to draw heat therefrom, and then out through the fan opening.

Condenser housings 128 contain the condensers 132 and define the pathway for the air drawn by condenser fans 150. Preferably, two condenser housings are arranged near the ceiling wall and at each end wall 112, 114, such that the condenser chamber is at an upper end corner of housing 110. Such an arrangement minimizes the footprint of the cooling unit 100, yet allows an extended condensing surface area. In a preferred arrangement, as shown in FIG. 1, the condenser housings 128 have an angled interior wall that angles inwardly upward, such that it is narrower at its bottom end than at its top end. As arranged, housings 128 allow condenser fans 150 to be located above supply and return openings 102, 104. Compressor housings 126 are disposed below condenser housings 128 such that each compressor 136 is preferably disposed adjacent to, and in relatively close proximity to, its corresponding condenser 132. In the preferred arrangement, the bottom end of each condenser housing 128 is joined with, shares a common wall with, or rests on the top end of the corresponding compressor housing 126. The locations of the compressors 136 is not limited; they can be disposed at any location within housing 110 as long as such does not interfere with any other component or airflow and does not increase the footprint of the housing 110. These alternative locations include on the horizontal floor 121 beneath heat exchanger scavenger fans 142 or any suitable location between side walls 112, 114.

Figure 3:
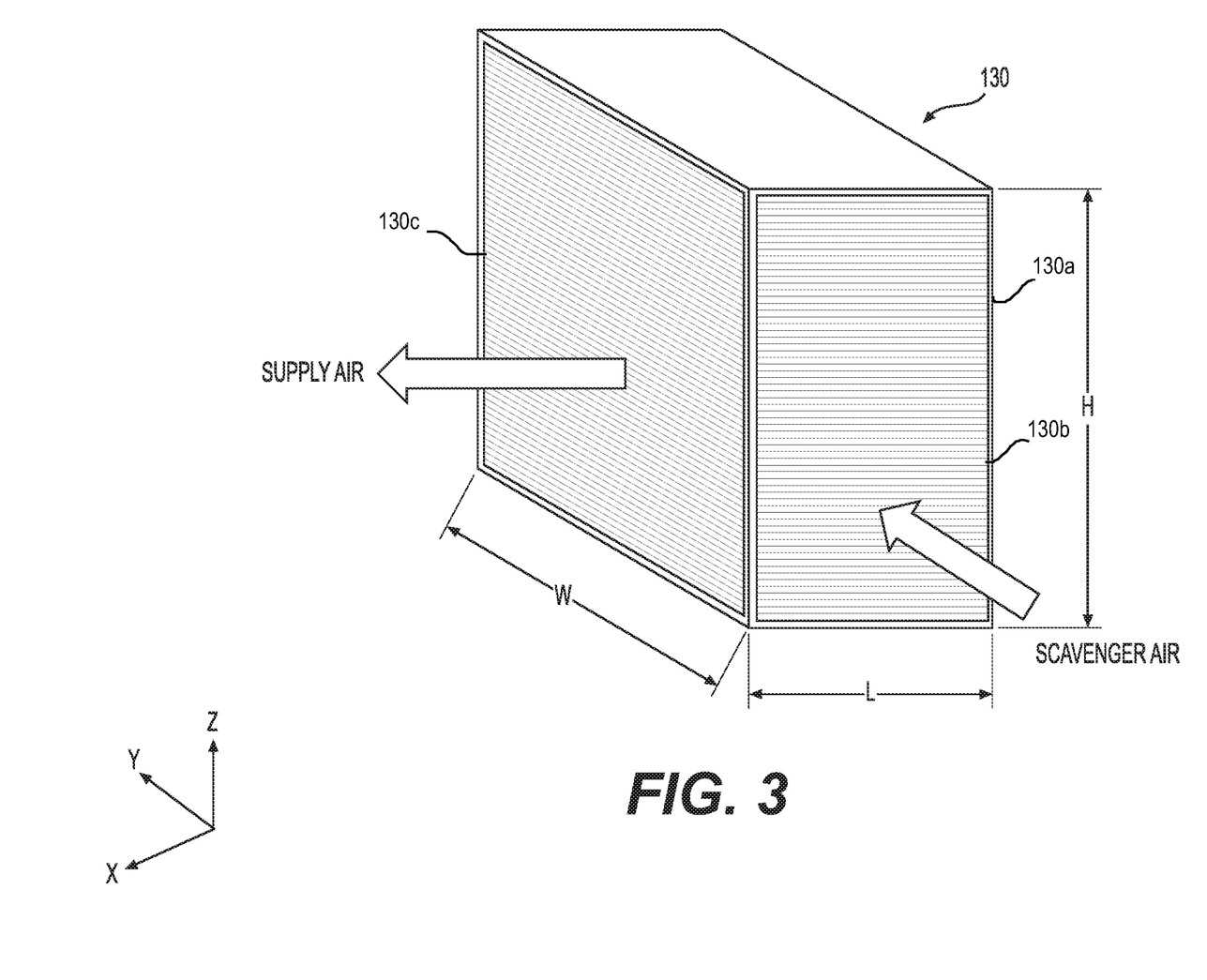
FIG. 3 is an enlarged perspective view of cross-flow heat exchanger in the air handling unit according to one aspect of the present invention.
Figure 4:
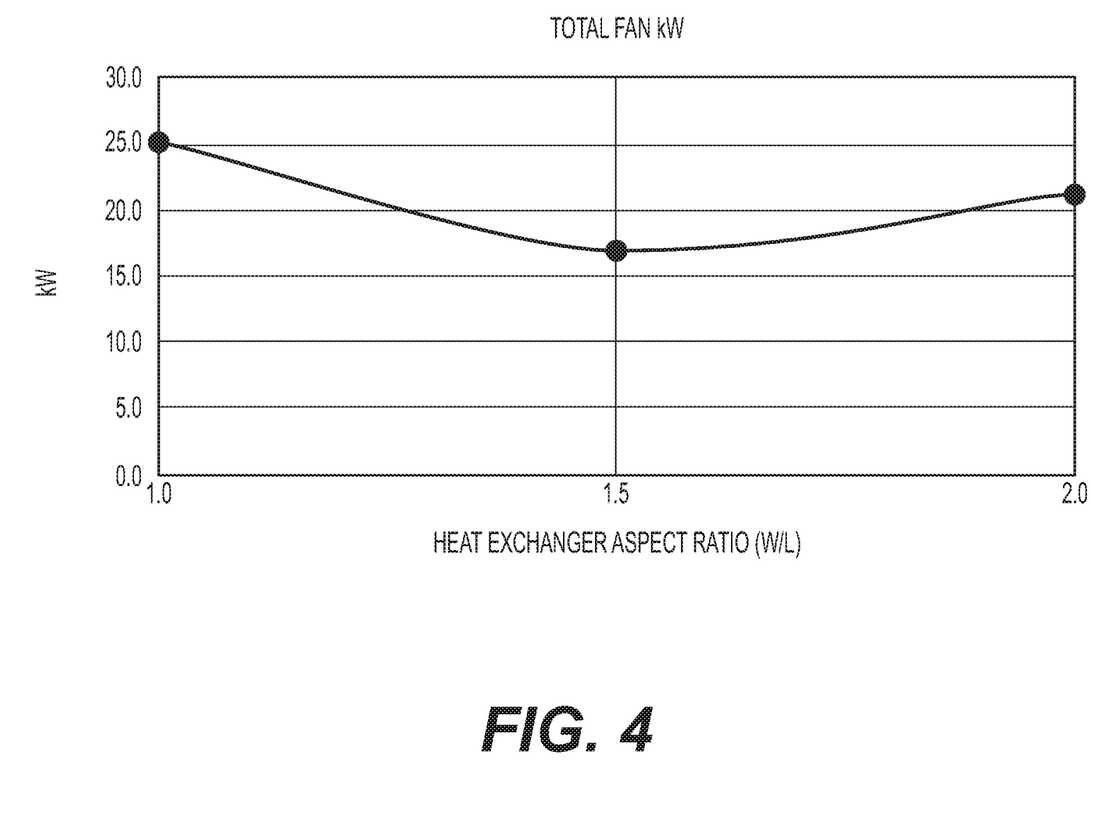
FIG. 4 is a chart showing the relationship between heat exchanger aspect ratio and the power consumed by the combination of supply (process) fans and scavenger fans operating at the maximum ambient dry bulb temperature of which the heat exchanger can reject 100% of data center heat exclusive of any refrigeration cooling.

As noted above, heat exchanger 130 is preferably of a crossflow horizontal plate type, in which the process air is directed horizontally across plural horizontal plates stacked vertically and separated by scavenger passages and the scavenger air is also directed horizontally through the scavenger passages in a direction perpendicular to the process air flow direction. Applicant discovered that the aspect ratio of the heat exchanger has a significant impact on cooling efficiency and energy use, and can minimize the footprint of the system. Generally speaking, making the scavenger passages longer than the process air passages provides improved efficiency and enables the system to be shortened in the longitudinal direction of supply airflow.

Referring to FIG. 3, heat exchanger 130 is defined by a length L in the X direction, a width W in the Y direction, and a height H in the Z direction. The process air is directed through the heat exchanger 130 in the longitudinal X direction and the scavenger air is directed through the heat exchanger in the perpendicular Y direction. Applicant has found that making the scavenger passages longer than the process air passages improves energy efficiency and allows to accommodate components of the DX system within a smaller footprint. Applicant further discovered that an aspect ratio (W/L, i.e., ratio of scavenger passage length to process air length) of 1.5 uses the lowest total fan energy. Various models were made and several tests were performed in order to come to that conclusion. The results of the testing are shown in Table 1 below.

TABLE 1

| | Plate FIX Properties | | | | | | | | | | | | |
|---|---|---|---|---|---|---|---|---|---|---|---|---|---|
| HX Option | Heat Exchanger Aspect Ratio (W/L) | L (in) | W (in) | H (in) | Plate Spacing (in) | Plate Area (100 SF) | HX Supply Eff | Supply Airflow (SCFM) | HX Supply APD (in WG) | Supply Fan kW due to HX | Scavenger Airflow (SCFM) | HX Scavenger APD (in WG) | Scavenger Fan kW due to HX | Total fan kW due to HX |
| A | 1.0 | 94.5 | 94.5 | 141.5 | 0.472 | 186 | 46.0% | 60000 | 1.76 | 20.7 | 34600 | 0.58 | 4.7 | 25.4 |
| B | 1.5 | 78.7 | 118.1 | 136.0 | 0.472 | 186 | 46.0% | 60000 | 0.80 | 9.4 | 36000 | 0.90 | 7.6 | 17.0 |
| C | 2.0 | 66.9 | 133.9 | 141.1 | 0.472 | 186 | 46.0% | 60000 | 0.58 | 6.8 | 37000 | 1.64 | 14.2 | 21.1 |

Two heat exchangers according to the present invention and a comparative heat exchanger were constructed and tested. The comparative heat exchanger had a square aspect ratio (W/L) of 1.0 and is identified as HX Option (or Example) A in Table 1, whereas the heat exchangers of the present invention had aspect ratios of 1.5 and 2.0 and are identified as HX Options B and C, respectively, in the Table. The collective surface area of the plates in each design was substantially equal (approximately 18,600 sq. ft.).

In testing the designs, the supply airflow was the same in each design (60,000 SCFM). However, because the pressure drop increases with an increase in process air length, the supply pressure drop was highest in Comparative Example A, was significantly less in Invention Example B, and was lowest in Invention Example C. This resulted in energy use by the supply fans (plenum fans 140) being highest in Example A and lowest in Example C.

On the other hand, the scavenger airflow differed in each Example to keep the heat exchanger efficiency substantially equal in each Example (e.g., 46.0%). One measure of heat exchanger efficiency is the ratio of 1) the difference between return air and supply air temperatures to 2) the difference in return air and ambient (outdoor) air temperatures. Further, due to the increasing length of the scavenger passages from Example A to Example C, the pressure drop correspondingly increased from Example A to Example C. As a result, the energy use by the scavenger fans was lowest in Example A and highest in Example C. However, the total energy used by the supply and scavenger fans in the various Examples was highest in Example A (1.0 aspect ratio), somewhat lower in Example C (2.0), and much lower in Example B (1.5). Accordingly, Example B with an aspect ratio of 1.5 had the best energy efficiency.

As mentioned above, as the aspect ratio of the heat exchanger 130 increases while keeping the effective surface area substantially the same, the length L in the X direction correspondingly decreases. That is, the higher the aspect ratio, the shorter the length L. By increasing the aspect ratio, the overall size of the housing 110 can be reduced, thus reducing the overall footprint. In addition, the shorter heat exchanger 130 provides more room for components of the DX unit at both ends of the housing without extending the length of the housing in the X direction, as further explained below.

In order to provide sufficient cooling by the DX sub-system, either alone or as a supplement to the heat exchanger 130, it is preferred to use two or more pairs of associated compressors 136 and condensers 132. Placing both pairs at one end of the housing 110, however, would increase the size of the unit at that end. Applicant has found that by locating one compressor/condenser pair at each end of the housing minimizes the space required at each end while still allowing the compressor to be positioned close to its associated condenser. For example, by extending the housing in the X direction beyond the supply and return openings 102, 104 just long enough to accommodate compressors 136 and their isolating housings will keep the housing length to its minimum required dimension. This arrangement also allows the design to use otherwise unused space above the supply and return openings 102, 104 so that the condensers 138 can be located close to their associated compressors 136 and not require any additional lengthening of the housing. To this end, condenser housings 128, which isolate the condenser scavenger airflow from the process air, are positioned above the respective compressors and supply or return openings 102, 104. In a preferred embodiment, each condenser fan 150 is provided in at least partial vertical alignment with either the supply opening 102 or the return opening 104.

While the preferred design provides a minimal footprint, particularly suitable for rooftop applications, efficiencies in operation are also realized. Because the scavenger fans are independent from the DX sub-system and can be shut down at higher ambient conditions when the heat exchanger provides no benefit, peak power savings are realized. Under lower ambient conditions, the DX sub-system can be shut down and the scavenger flow can be reduced as required for control of the process leaving air temperature. For example, with the scavenger flow set at one-half the process air flow at an ambient temperature of 43° F., return air at 101° F. can be lowered to 77° F. supply air.

Thus, there has been shown and described a new and useful indirect air-side economizer system that can operate with or without the use of water in the cooling process. Although this invention has been exemplified for purposes of illustration and description by reference to certain specific embodiments, it will be apparent to those skilled in the art that various modifications, alterations, and equivalents of the illustrated examples are possible.

What is claimed is:

1. A cooling system, including an indirect heat exchange sub-system and an active refrigeration sub-system, for cooling process air and providing the process air to a space, the system comprising:

a housing having front and back side walls facing one another in a first direction, left and right end walls facing one another in a second direction transverse to the first direction, and a bottom and a top facing one another in a third direction transverse to the first and second directions, the housing further including a process air supply opening connecting with the space, a process air return opening connecting with the space, a heat exchanger scavenger air inlet opening, a heat exchanger scavenger air exhaust opening, condenser air inlet openings, and condenser air exhaust openings;

a horizontal plate-type heat exchanger of the indirect heat exchange sub-system provided in the housing, the horizontal plate-type heat exchanger including stacked horizontal plates separated by scavenger passages, the scavenger passages extending in the first direction, the stacked horizontal plates defining horizontal process air passages extending in the second direction, the scavenger passages being longer in the first direction than the process air passages are in the second direction;

two groups of compressors and associated condensers of the active refrigeration sub-system, each of the two groups including at least one compressor and at least one associated condenser, one of the two groups being located within the housing near the right end wall and the other of the groups being located within the housing near the left end wall;

at least one process air fan for directing the process air from the process air return opening, through the horizontal process air passages of the horizontal plate-type heat exchanger, and then through the process air supply opening and into the space;

at least one heat exchanger scavenger fan for directing scavenger air from ambient, through the scavenger passages of the horizontal plate-type heat exchanger, and then back to ambient; and two groups of condenser fans for directing condenser air from ambient, through the condensers, and then back to ambient, each of the two groups including at least one condenser fan, one of the two groups of condenser fans being located at the top of the housing near the right end wall and the other of the two groups of condenser fans being located at the top of the housing near the left end wall.

2. The cooling system according to claim 1, wherein the active refrigeration sub-system further includes an evaporator, disposed between the horizontal plate-type heat exchanger and the process air supply opening.

3. The cooling system according to claim 1, wherein the at least one compressor and the at least one associated condenser of each group of the two groups of compressors and associated condensers of the active refrigeration sub-assembly are disposed one above the other.

4. The cooling system according to claim 1, wherein the condenser fans are vertically aligned with at least a part of the process air supply opening and the process air return opening, respectively.

5. The cooling system according to claim 1, wherein a ratio of the length of the scavenger passages in the first direction to the length of the process air passages in the second direction defines a heat exchanger aspect ratio, the heat exchanger aspect ratio being greater than 1.0.

6. The cooling system according to claim 5, wherein the heat exchanger aspect ratio is 1.5.

7. The cooling system according to claim 1, wherein each group of the two groups of compressors and associated condensers of the active refrigeration sub-system includes at least two compressors.

8. The cooling system according to claim 1, wherein each group of the two groups of condenser fans includes at least two condenser fans.

9. A cooling system, including an indirect heat exchange sub-system and an active refrigeration sub-system, for cooling process air and providing the process air to a space, the system comprising:
   a housing having front and back side walls facing one another in a first direction, two end side walls facing one another in a second direction transverse to the first direction, and a bottom and a top facing one another in a third direction transverse to the first and second directions, the housing further including a process air supply opening connecting with the space, a process air return opening connecting with the space, a heat exchanger scavenger air inlet opening, a heat exchanger scavenger air exhaust opening, condenser air inlet openings, and condenser air exhaust openings;
   a horizontal plate-type heat exchanger of the indirect heat exchange sub-system provided in the housing;
   two groups of compressors and associated condensers of the active refrigeration sub-system, each of the two groups including at least one compressor and at least one associated condenser, one of the two groups being located within the housing near one of the end side walls and the other of the two groups being located within the housing near the other of the end side walls; and
   two groups of condenser fans for directing condenser air from ambient, through the condensers, and then back to ambient, each of the two groups including at least one condenser fan, one of the two groups of condenser fans being located at the top of the housing near the one side end wall and vertically aligned with at least a part of the process air supply opening, and the other of the two groups of condenser fans being located at the top of the housing near the other end side wall and vertically aligned with at least a part of the process air return opening.

10. The cooling system according to claim 9, wherein the active refrigeration sub-system further includes an evaporator, disposed between the horizontal plate-type heat exchanger and the process air supply opening.

11. The cooling system according to claim 9, wherein the at least one compressor and the at least one condenser of each group of the two groups of compressors and associated condensers of the active refrigeration sub-system are disposed one above the other.

12. The cooling system according to claim 9, wherein a ratio of the length of the horizontal plate-type heat exchanger in the first direction to the width of the heat exchanger in the second direction defines a heat exchanger aspect ratio, the heat exchanger aspect ratio being greater than 1.0.

13. The cooling system according to claim 12, wherein the heat exchanger aspect ratio is 1.5.

14. The cooling system according to claim 9, wherein each group of the two groups of compressors and associated condensers of the active refrigeration sub-system includes at least two compressors.

15. The cooling system according to claim 9, wherein each group of the two groups of condenser fans includes at least two condenser fans.

* * * * *